(12) United States Patent
Val

(10) Patent No.: US 6,716,672 B2
(45) Date of Patent: Apr. 6, 2004

(54) THREE DIMENSIONAL INTERCONNECTION METHOD AND ELECTRONIC DEVICE OBTAINED BY SAME

(75) Inventor: Christian Val, St. Remy les Chevreuse (FR)

(73) Assignee: 3D Plus, Buc (FR)

( * ) Notice: Subject to any disclaimer, the term of this patent is extended or adjusted under 35 U.S.C. 154(b) by 0 days.

(21) Appl. No.: 10/182,720

(22) PCT Filed: Jan. 30, 2001

(86) PCT No.: PCT/FR01/00283
§ 371 (c)(1),
(2), (4) Date: Aug. 9, 2002

(87) PCT Pub. No.: WO01/59841
PCT Pub. Date: Aug. 16, 2001

(65) Prior Publication Data
US 2003/0013231 A1 Jan. 16, 2003

(30) Foreign Application Priority Data
Feb. 11, 2000 (FR) .............................................. 00 01750

(51) Int. Cl.⁷ .............................................. H01L 21/44
(52) U.S. Cl. ..................... 438/109; 438/109; 438/127; 438/128; 361/735; 361/813; 257/678; 257/686; 257/693
(58) Field of Search ................................ 438/109, 127, 438/128, 67; 361/735, 813; 257/686, 693, E21.504, 678; 29/856, 830

(56) References Cited

U.S. PATENT DOCUMENTS

| | | | | |
|---|---|---|---|---|
| 3,370,203 A | * | 2/1968 | Kravitz et al. | ............... 361/730 |
| 5,270,261 A | * | 12/1993 | Bertin et al. | |
| 5,400,218 A | | 3/1995 | Val | |
| 5,526,230 A | | 6/1996 | Val | |
| 5,561,591 A | * | 10/1996 | Burns | ........................ 361/704 |
| 5,637,536 A | | 6/1997 | Val | |
| 5,640,760 A | | 6/1997 | Val et al. | |
| 5,847,448 A | | 12/1998 | Val et al. | |
| 5,885,850 A | | 3/1999 | Val | |

* cited by examiner

Primary Examiner—Vuthe Siek
Assistant Examiner—Belur V Keshavan
(74) Attorney, Agent, or Firm—Oblon, Spivak, McClelland, Maier & Neustadt, P.C.

(57) ABSTRACT

A method of interconnection in three dimensions and to an electronic device obtained by the method. To increase the compactness of integrated circuit modules, the method stacks and adhesively bonds packages containing a chip connected to output leads by connection conductors inside each package, cuts through the packages near the chips to form a block, the conductors being flush with the faces of the block, and makes the connections on the faces of the block by metalizing and then etching the outlines of the connections. The method also applies to the matching of packages in the replacement of obsolete circuits.

12 Claims, 5 Drawing Sheets

THREE DIMENSIONAL INTERCONNECTION METHOD AND ELECTRONIC DEVICE OBTAINED BY SAME

The invention relates to a method of interconnection in three dimensions for packages containing at least one electronic component. It also relates to an electronic device obtained by this method.

The production of current electronic systems, whether civil or military, must take into account the requirements of ever increasing compactness, because of the ever increasing number of circuits involved.

In this search for greater compactness, it has already been proposed to produce stacks of integrated circuit chips or, as described in French patent FR 2 688 630, chip-encapsulating packages, the interconnection being accomplished in three dimensions using the faces of the stack as interconnection surfaces for making the necessary connections between output leads.

The encapsulation of chips in plastic packages, such as for example the standard packages of SOJ (Small Outline J-lead), TSOP (Thin Small Outline Package) or CSP (Chip Scale Package) type has many advantages. Firstly, these packages have been tested and burned-in by the manufacturer, although these operations are very difficult to carry out on bare chips. Moreover, it is generally difficult to obtain bare chips from manufacturers. The combination of these reasons therefore makes it preferential to use packages, which are appreciably less expensive and easier.

The stacking of packages according to the solution of the abovementioned patent involves the following main operations: straightening the output leads in order to facilitate alignment and molding; stacking of the plastic packages; encapsulation with resin and curing; cutting of the block; metalization; etching of the outlines of the connections on the faces of the block. Moreover, since the cutting is carried out on the outside of the packages in order to use the output leads of the packages for the interconnection in three dimensions, the 3D module obtained always has, in the plane of the packages, dimensions greater than the original packages.

The object of the invention is, on the one hand, to simplify the operations of manufacturing a 3D module and, on the other hand, to appreciably reduce the volume occupied. It is based on the idea of cutting the block not any longer on the outside of the packages, but through these packages.

According to the most general aspect of the invention, what is therefore provided is a method of interconnection in three dimensions for at least one package containing at least one electronic component and furnished with connection conductors for connecting, inside said package, connection pads on the component to output leads toward the outside of the package, said method being characterized in that it comprises the following steps:

a) stacking and assembling the elements to be interconnected;

b) cutting through the package or packages, near said components, in order to form a block leaving the cross section of the connection conductors flush;

c) production of the electrical connections between the conductors of the various elements on the faces of said block.

More particularly, for interconnecting several packages together, provision is made for said stacking and assembling step a) to consist in stacking and adhesively bonding the packages.

This method thus dispenses with the operations of straightening the output leads and of encapsulation and curing, the latter being replaced by a simple adhesive bonding operation. The method has thus been simplified.

Moreover, the cutting of the block is carried out near the chips, and therefore through the packages, and no longer on the outside of the packages, hence a reduction of almost 50% in the area of the block in a plane parallel to the packages.

To achieve this solution to the problems of reducing the volume of the electronic devices, it is clear that it was necessary, on the one hand, to go counter to the idea that a package is needed for various functions, namely protection against the external environment, handling not hazardous to the chip and electrical connection to the outside, and must not be cut, and that it was necessary, on the other hand, to state that the transfer molding resins used on the inside of the packages by the semiconductor industry were substantially of the same composition and filler content as the encapsulation resins used in the prior art.

Another, particularly beneficial, application relates to the replacement of complex components rendered obsolete, that is to say no longer available on the market, when, for example, a new series of an old piece of equipment has to be manufactured. During the original design of the equipment, ASIC circuits were able in particular to be defined, which were produced by a supplier who, since then, has changed technology. Hitherto, it was necessary to redevelop a new ASIC. However, there are programmable integrated circuits with a sea of ports, of the FPGA (Field Programmable Gate Array) which would make it possible to program the same functions as the original ASIC circuit. The drawback is that the arrangement, the number of outputs and the dimensions of the ASIC circuit are different from those of the FPGA circuits available: in general, the FPGA circuits, with very large-scale integration, have a substantially larger number of outputs than the ASIC circuit that it would be desired to replace. To produce the functions of an ASIC with 44 outputs for example, only this number of outputs of an FPGA circuit (for example with 144 outputs) would be used. In addition, the arrangement of these outputs will not be the same, hence a mismatch with respect to the card on which this circuit has to be mounted. Finally, there is a risk of the footprint of the FPGA circuit being different and, in general, larger.

The invention makes it possible, through its principle, to solve these problems. According to this new application, provision is made to associate with a complex circuit contained in a package a matching circuit consisting of a printed circuit, of a first array of selection conductors, allowing it to be connected to the suitable outputs of the package, and of a second, matching array, the leads of which reproduce, in terms of number and arrangement, the desired pattern, the printed circuit providing the interconnection between the two arrays.

By implementing the invention, it is thus possible to produce an electronic circuit with interconnection in three dimensions, of small footprint, suitable for the desired application.

This other aspect of the invention therefore provides a method, as generally defined above, for interconnecting a package with a circuit for matching the array of the output leads, characterized in that said stacking and assembly step a) consists in stacking and assembling said matching circuit against said package by adhesive bonding or encapsulation.

The invention will be more clearly understood and further features and advantages will become apparent from the description below and from the appended drawings in which.

Figure 1:
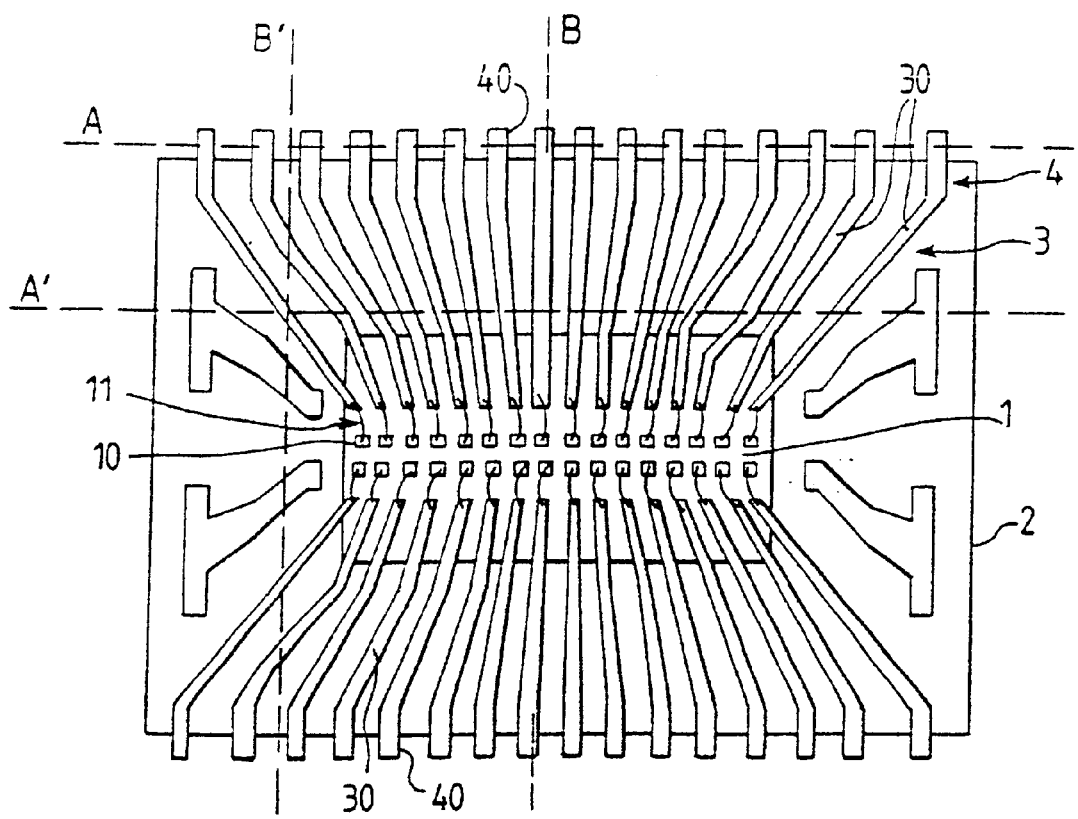
FIG. 1 is a view of the inside and from above of a package showing the connections of a chip to the output leads.

FIG. 1 shows, by way of example and in a simplified manner, the inside of a TSOP package seen from above. A chip 1 (for example a memory chip) has connection pads 10 aligned in two rows. These pads are connected to an array 4 of output leads 40 via a set 3 of connecting conductors 30. The link between the pads 10 and the conductors 30 is made by connecting up the wires 11. The assembly is enclosed in a plastic package 2.

Figure 2:
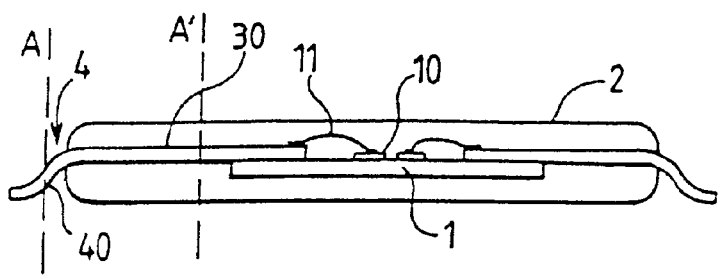
FIG. 2 is a sectional view of the package of FIG. 1 in the plane B.

FIG. 2 shows the package 2 in section in the plane B. The conductors 30 terminate in bent-over output leads 40.

Figure 3:
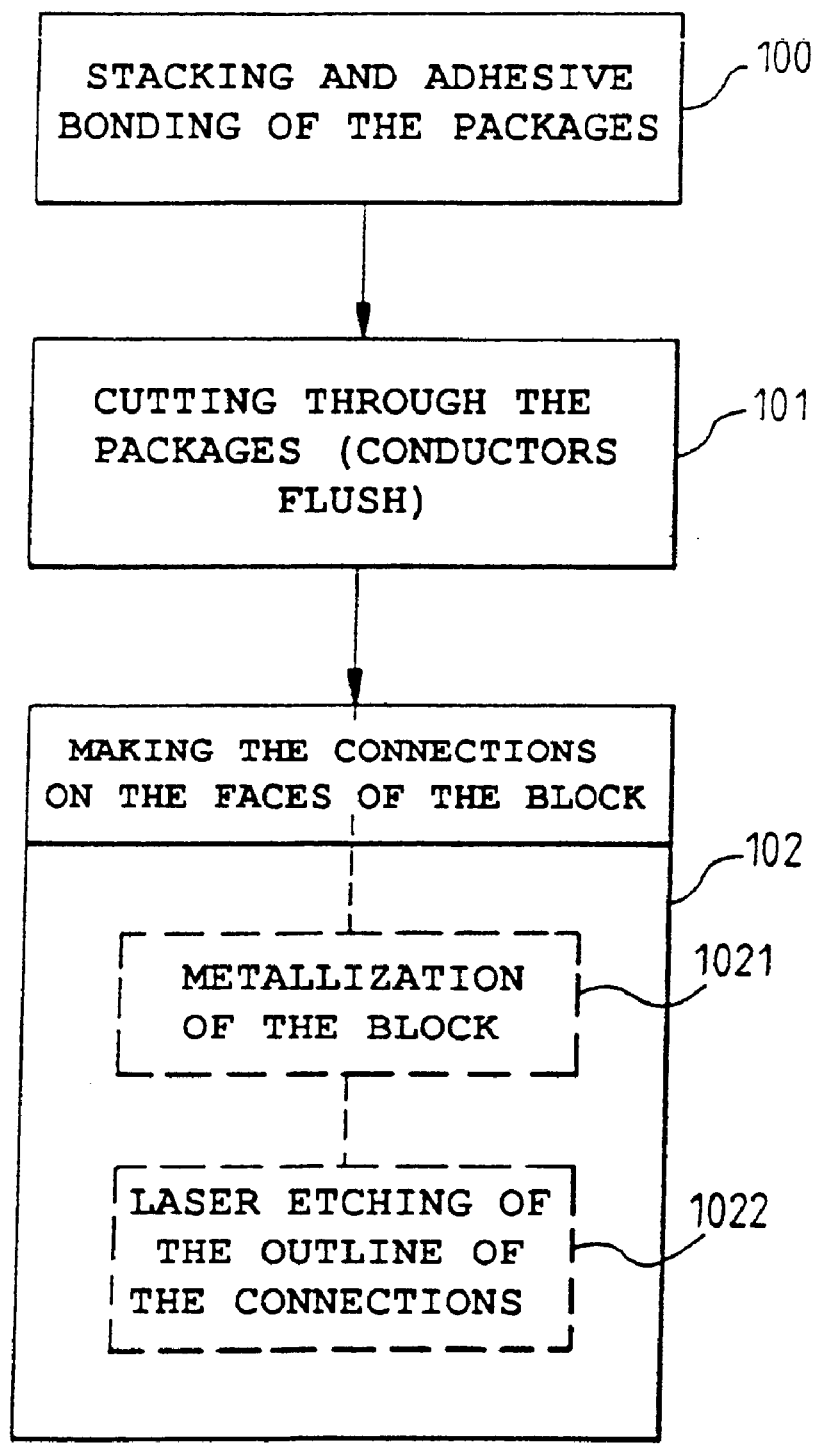
FIG. 3 shows the block diagram of the method according to the invention.
Figure 4:
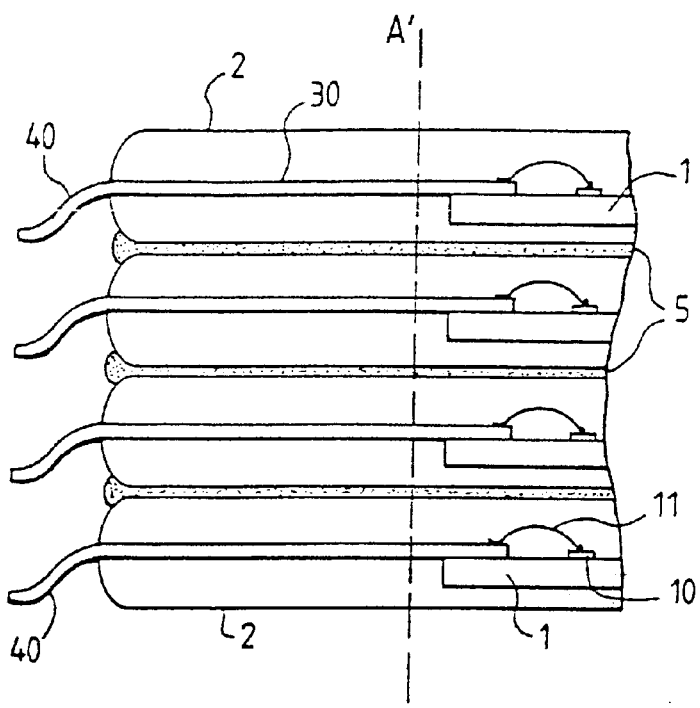
FIG. 4 is a sectional view of how the packages are assembled during one step of the method according to the invention.

The method according to the invention, applied to the mutual interconnection in three dimensions of packages, is illustrated by the block diagram of FIG. 3. In a first step 100, the packages are stacked and assembled by adhesive bonding as shown in FIG. 4, in which the reference 5 denotes films of adhesive between the packages.

In a second step 101, the assembly is cut, not at the output leads in the plane A for example (FIG. 1), as in the prior art, but through the packages 2, in the plane of cutting A' (or B') near the chip 1 so as to cut the connection conductors 30, the section 31 of which is flush with the faces of the block obtained.

As may be seen, the planes of sections such as A' or B' are much closer to the chip 1, hence a considerably reduced footprint. For example, the sawing may be carried out at a distance of between 0.5 and 2 mm around the chip, depending on the chip wire-bonding techniques used by the semiconductor manufacturer.

Figure 5:
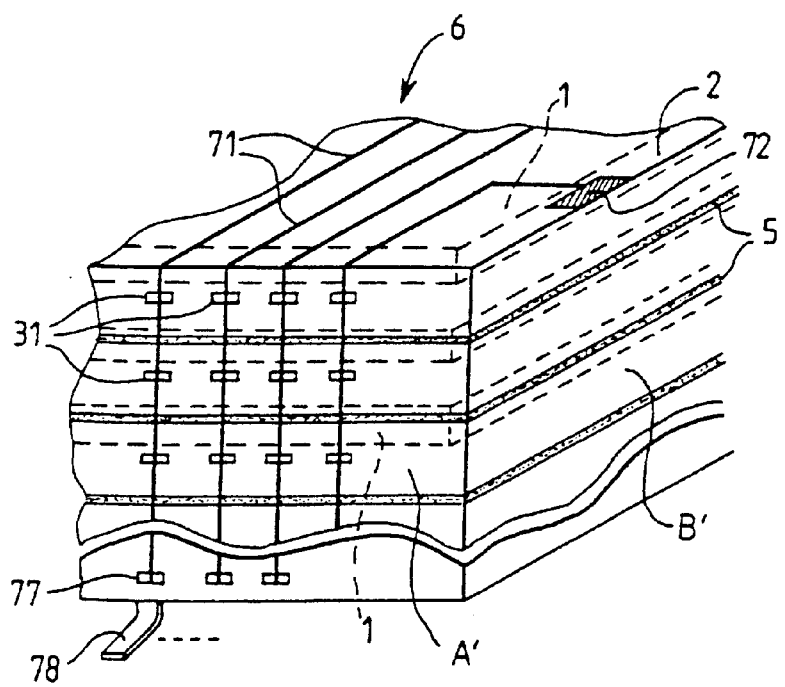
FIG. 5 is a partial perspective view of the 3D module obtained.

Step 102 then consists in making the connections between the conductors of the various packages to the faces of the block obtained. Various techniques can be used to do this. Preferably, in a first stage 1021, the faces of the block are metalized and, in a second stage 1022, the outline of the connections are etched, for example by laser etching. The block 6 obtained is shown in FIG. 5. It may be seen that the section 31 of the connection conductors of the packages 2 are connected by connections 71 on the faces of the block 6, which may terminate in connection pads 72 toward the outside or to the sections 77 of the output arrays 78 of the block. This step of the process is described in detail in, for example, the aforementioned patent FR 2 688 630.

As may be seen, the method according to the invention allows the manufacture of the 3D modules to be simplified by eliminating the operation of straightening the output leads or tabs, since they are removed during the cutting, and by replacing the encapsulation and curing step with a single adhesive bonding operation.

Another application of the invention will now be described within the context of the replacement of a specific circuit of the ASIC type with a circuit of general application of the FPGA type, which may be programmed in order to fulfil the functions of the original ASIC circuit. As already explained, such a programming operation means in general that only some of the ports and outputs of the FPGA circuit are used and the arrangement of the outputs has to be redistributed in order to be matched to the application envisioned.

Figure 6:
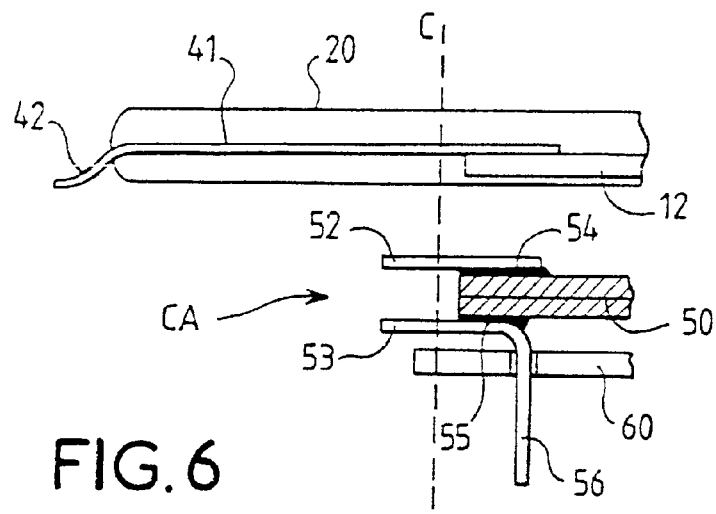
FIG. 6 illustrates an initial step of an application variant of the invention.

To do this, knowing the number of outputs to be used and their distribution, a matching circuit CA (FIG. 6) is produced, which comprises a first selection array 52 placed on one face and on the edges of a printed circuit 50 facing the package 20 of the FPGA circuit. This package contains at least one chip 12 whose connection pads (not shown) are connected to the leads 42 of an output array via conductors 41. The leads 52 of the selection array are positioned so as to correspond to the conductors 41 used, in what will be the plane of cutting C. Moreover, the opposite face of the printed circuit 50 carries, along its edges, a matching array of output leads 53, the positioning of which is that of the leads of the ASIC circuit that it is wished to replace. The interconnection between the two arrays is effected by means of the tracks of the printed circuit 50. The leads 52 are soldered to these tracks by the soldered joints 54 and the leads 53 by the soldered joints 55. For assembling the package and the matching circuit CA, an array support 60 is provided, the end 56 of the leads of the array 53 engaging in the slots of the array support.

Figure 7:
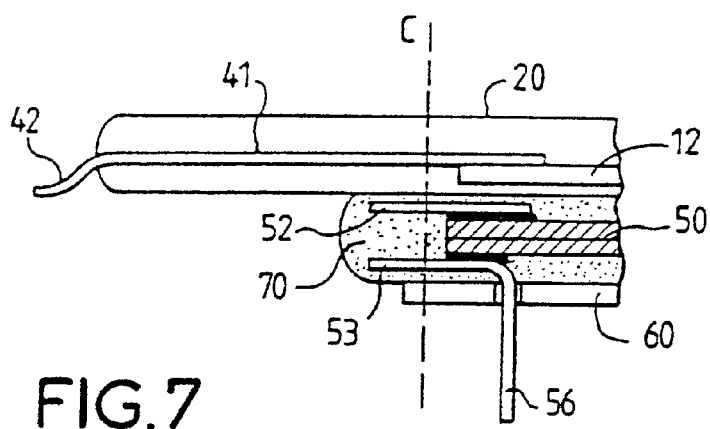
FIGS. 7 and 8 show sectional views during successful steps of the variant of FIG. 6.
Figure 10:
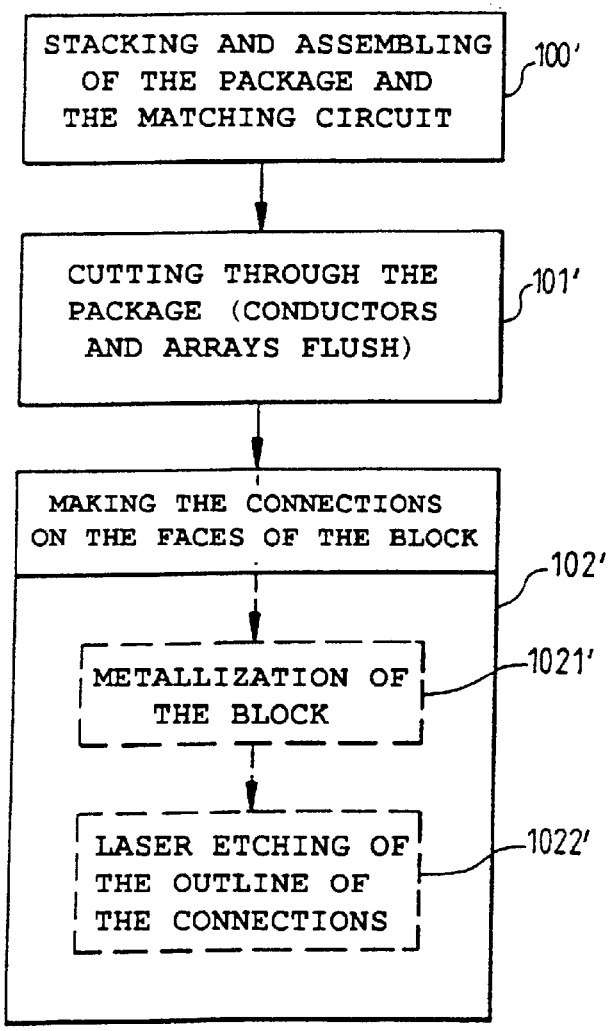
FIG. 10 is the block diagram of the method according to this variant of the invention.

In a first step 100' (FIG. 10), the package 20 and the matching circuit CA are assembled so that the plane of cutting C is near the chip 12 and cuts off the ends of the arrays 52 and 53. The assembling operation is performed, for example, using beads of adhesive placed on both faces of the printed circuit 50. The total amount of adhesive must be sufficient to fill the volumes lying between the printed circuit 50 and the package 20 and the array support 60, respectively, and so that an excess flows out at 70 during assembling, so as to allow the sawing through the core of the adhesive (with neither an empty space nor holes). Under the pressure used to assembly the package 20 to the support 60, as has just been mentioned, the adhesive flows out in order to coat the ends of the leads 52 and 53, as shown at 70 in FIG. 7. The assembling operation may also be performed by encapsulation between package and support 60 with a curable resin, such as an epoxy resin.

The next step 101' consists, as previously, in cutting through the package through the plane C.

Figure 8:
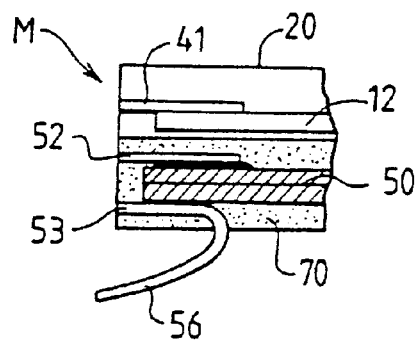

A block M is thus obtained, seen in partial section in FIG. 8, in which the conductors 41 and the leads of the arrays 52 and 53 are flush with the face of the block. This FIG. 8 furthermore shows that the end 56 of the leads of the matching array have been suitably bent over.

Step 102' (FIG. 10) then consists in making, on the faces of the block M, the desired connections in three dimensions between the conductors 41 of the package and the leads of the first selection array 52, using any conventional technology.

For example, the faces of the block are metalized (1021') and then the outlines of the connections are etched (1022') for example by laser etching.

Figure 9:
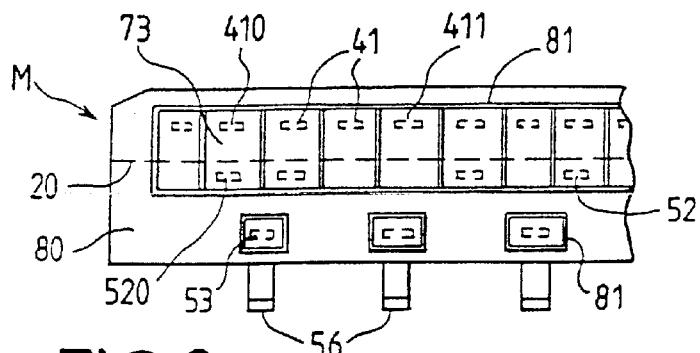
FIG. 9 is a side view of the module obtained.

FIG. 9 shows, seen from the side, the module M obtained. On the face shown may be seen the sections of the conductors 41, of the selection array 52 and of the matching array 53. The metalization 80 covers all the faces of the block M. Laser etching 81 is used to etch the outline of the connections between conductors 41 and leads of the array 52 and to isolate the leads of the matching array 53. For example, a used output 410 of the package is connected via the connection 73 to the lead 520. In contrast, outputs such as 411 are not used.

Of course, the illustrative examples described in no way limit the invention; in particular, techniques other than complete metalization of the block could be used to make the connections in 3D, or etching methods other than laser etching could be used. Provision could also be made not to extend the leads 53 beyond the edge of the printed circuit, which would avoid having to make them flush and therefore having to isolate them by etching. However, since the interconnection between the output array 56 and the electronic circuit 12 is achieved by soldering the array to the printed circuit 50, for applications requiring high reliability in a harsh environment, it is undesirable for there to be a risk of the solder (tin/lead, whose melting point is in general 180° C.) reflowing when the assembly is itself soldered to a printed circuit card having all the other components. The interconnection via the metalized face of the block therefore makes this connection of the array 56 secure. However, for many noncritical applications, the fact of simply soldering the array to the printed circuit 50 constitutes a real simplification.

What is claimed is:

1. A method of interconnection in three dimensions for at least two packages each containing at least one electronic component and furnished with connection conductors for connecting, inside the at least two packages, connection pads on each of at least one electronic component to output leads toward an outside of the at least two packages, the method comprising:
   a) stacking and assembling the at least two packages to be interconnected;
   b) cutting through the at least two packages, near the electronic components, to form a block leaving cross sections of the connection conductors flush on faces of the block;
   c) producing electrical connections between the cross sections of the connection conductors that are flush on the faces of the block.

2. The method as claimed in claim 1, for interconnecting plural packages together, wherein said stacking and assembling a) includes stacking and adhesively bonding the plural packages.

3. The method as claimed in claim 1, wherein each electronic component is an electronic chip, and the cutting b) is carried out at a distance of between about 0.5 and 2 mm from the electronic chips.

4. The method as claimed in claim 1, wherein the producing the electrical connections c) comprises:
   c1) metalizing the faces of the block; and
   c2) etching outlines of the connections.

5. The method as claimed in claim 4, wherein etching the outlines of the connections c2) is carried out by laser etching.

6. A method of interconnection in three dimensions for at least one package that contains at least one electronic component and is furnished with connection conductors inside the at least one package, and a matching circuit including a printed circuit, of a first selection array and of a second matching array, said first and second arrays being placed along edges of the matching circuit, the method comprising:
   a) stacking and assembling the matching circuit against the at least one package;
   b) cutting through the at least one package, near the electronic components, to form a block leaving cross section of the connection conductors flush on faces of the block;
   c) making electrical connections between the cross sections of the connection conductors that are flush on the faces of the block.

7. The method as claimed in claim 6, for interconnecting the at least one package with a circuit for matching an array of output leads, wherein the stacking and assembly a) includes stacking and assembling the matching circuit against the at least one package by adhesive bonding or encapsulation.

8. The method as claimed in claim 7, wherein said matching circuit includes a printed circuit along edges of which, on a face that faces the at least one package, a first array for selecting the output leads of the package to be connected and a second matching array are placed, the matching circuit is assembled with the at least one package so that a plane of cutting cuts off ends of the first and second arrays of the matching circuit.

9. The method as claimed in claim 6, wherein the at least one electronic component is an electronic chip, and the cutting b) is carried out at a distance of between 0.5 and 2 mm from the electronic chips.

10. An electronic device with interconnection in three dimensions, comprising packages that contain at least one electronic component and are furnished with connection conductors inside the packages, in which electronic device, the packages are stacked and adhesively bonded, wherein the electronic device is formed by a block cut through the packages near the electronic components so that the connection conductors are flush with faces of the block, and wherein the faces of the block bear connections connecting the connection conductors.

11. An electronic device with interconnection in three dimensions, comprising:
   a package that contains at least one electronic component and is furnished with connection conductors inside the package;
   a matching circuit with which the package is assembled and including a printed circuit of a first selection array and of a second matching array, the first and second arrays being placed along edges of the printed circuit, on first and second faces of the printed circuit, respectively, the first face carrying the first array facing the package and the package/matching circuit assembly having been cut through the package, and ends of the first and second arrays form a block in which a section of the connection conductors and of the first and second arrays is flush with faces of the block, and wherein the faces of the block carry connections connecting said connection conductors to the first selection array.

12. The electronic device as claimed in claim 11, wherein the faces of the block are metalized and etched to define outlines of said connections and to isolate the sections of the second array.

\* \* \* \* \*